United States Patent
Livesay et al.

[11] Patent Number: 6,132,814
[45] Date of Patent: Oct. 17, 2000

[54] METHOD FOR CURING SPIN-ON-GLASS FILM UTILIZING ELECTRON BEAM RADIATION

[75] Inventors: William R. Livesay; Matthew F. Ross, both of San Diego; Anthony L. Rubiales, Poway, all of Calif.

[73] Assignee: Electron Vision Corporation, San Diego, Calif.

[21] Appl. No.: 08/856,888

[22] Filed: May 14, 1997

Related U.S. Application Data

[63] Continuation of application No. 08/437,461, May 8, 1995, abandoned.

[51] Int. Cl.$^7$ ..................................................... B29C 71/02
[52] U.S. Cl. ..................... 427/542; 427/240; 427/294; 427/379; 427/551; 427/557; 427/595; 437/231
[58] Field of Search ..................................... 427/294, 542, 427/551, 557, 240, 379; 437/231

[56] References Cited

U.S. PATENT DOCUMENTS

| | | | |
|---|---|---|---|
| 4,041,190 | 8/1977 | Dubois et al. | 427/43 |
| 4,222,792 | 9/1980 | Lever et al. | 148/1.5 |
| 4,596,720 | 6/1986 | Keryk et al. | 427/54.1 |
| 4,600,685 | 7/1986 | Kitakohji et al. | 430/313 |
| 4,983,546 | 1/1991 | Hyun et al. | 437/231 |
| 5,024,969 | 6/1991 | Reche | 437/173 |
| 5,119,164 | 6/1992 | Sliwa, Jr. et al. | 357/54 |
| 5,192,697 | 3/1993 | Leong | 437/37 |
| 5,192,715 | 3/1993 | Sliwa, Jr. et al. | 437/195 |
| 5,376,586 | 12/1994 | Beilin et al. | 437/195 |

OTHER PUBLICATIONS

Akira Imai et al., *Novel Process for Direct Delineation of Spin on Glass (SOG)*. Jpn. J. Appl. Phys., vol. 29, No. 11, Nov. 1990, pp. 2653–2656.

N. Moriya et al., *Modification Effects in Ion–Implanted SiO$_2$ Spin–on–Glass*. J. Electrochem. Soc., vol. 140, No. 5, May 1993, pp. 1442–1450.

Young–Bum Koh et al., *Direct Patterning of Spin–on Glass by Focused Ion Beam Irradiation*. Jpn. J. Appl. Phys., vol. 31, No. 12B, Dec. 1992, pp. 4479–4482.

Robert W. Christy, *Formation of Thin Polymer by Electron Bombardment*. J. Appl. Phys., vol. 31, No. 9, Sep. 1960, pp. 1680–1683.

N. Moriya et al., *Large increase of refractive index and compactness in siloxane–type spin–on–glass induced by ion implantation*, Appl. Phys. Lett. 57(2), Jul. 9, 1990, pp. 108–110.

W.W. Molzen et al., *Materials and techniques use in nanostructure fabrication*, J. Vac. Sci. Technol., 16(2), Mar./Apr. 1979, pp. 269–72.

S.S. Elovikov et al. *Controlled formation of thin polymer films by electron radiation*, Thin Solid Films, vol. 62, pp. 303–316 (1979) (no month avail.).

*Primary Examiner*—Bernard Pianalto
*Attorney, Agent, or Firm*—Noel F. Heal

[57] ABSTRACT

An electron beam exposure method is described which provides a means of curing spin-on-glass formed on a semiconductor wafer which insulates the conductive metal layer and planarizes the topography in the process of manufacturing multilayered integrated circuits. The method utilizes a large area, uniform electron beam exposure system in a soft vacuum environment. A wafer coated with uncured siloxane spin-on-glass is irradiated with electrons of sufficient energy to penetrate the entire thickness of the spin-on-glass and is simultaneously heated by infrared heaters. The wafer is exposed to a predetermined dose of electrons while simultaneously raised to a peak temperature in a soft vacuum environment. The electron beam and infrared heaters are then extinguished and the substrate cooled before removing from vacuum.

30 Claims, 1 Drawing Sheet

METHOD FOR CURING SPIN-ON-GLASS FILM UTILIZING ELECTRON BEAM RADIATION

This application is a continuation of application Ser. No. 08/437,461 filed May 8, 1995, now abandoned.

BACKGROUND OF THE INVENTION

1. Field of the Invention

This invention relates generally to the fabrication of semiconductor devices and, more particularly, to methods for curing spin-on-glass (often referred to as SOG) used in semiconductor devices.

2. Description of the Prior Art

Interlayer dielectrics utilized in multilevel interconnection in manufacturing of ultra-large scale integrated circuits have requirements to provide gap filling into high aspect ratio gaps (between metal conductors) and a high flatness of the topology (planarization). To meet these requirements, numerous interlevel dielectric formation processes have been investigated. Tetraethylorthosilicate (TEOS) based chemical vapor deposition (CVD), biased high density plasma CVD combined with chemical mechanical polishing (CMP) have been developed. There are a number of problems with these technologies including: particle generation, process reliability, cost and gap filling capability. Spin-on-glass processes have been utilized and offer simplicity, better gap filling and planarization than these other techniques.

In integrated circuit process technology, the fabrication of reliable interconnect structures with high yields require the deposition of metallization layers of uniform thickness and their subsequent patterning while preserving critical dimensions and line widths. These process goals are difficult to realize unless the substrate is planarized prior to the metallization step. That is, the interlayer dielectric must fill the space between the closely packed vertical wall metal lines of the lower interconnect level so as to produce a smooth topography. Spin-on-glass materials are limited in terms of thickness by their tendency to crack when made in thick layers and cured. Spin-on-glass liquids consist of a silicon oxygen network of polymers, one of which is siloxane, dissolved in an organic solvent (typically a combination of a high boiling point solvent and a low boiling point solvent). The dissolved spin-on-glass material is coated onto the semiconductor wafer by spinning at high speed. The spin-on-glass material fills gaps and the uneven topography of the integrated circuit wafer, thereby planarizing it. After spinning onto a substrate, low boiling point solvents are expelled via a low temperature hot plate bake. The wafer is then heated in vacuum or nitrogen to 300°–400° C. This removes higher boiling point solvents and components which can cause cracking and corrosion at subsequent process steps. Very thin coatings are applied this way. If thick coatings are used, the spin-on-glass film cracks due to shrinkage in the baking steps. If a thicker coating is required, multiple coatings must be applied and vacuum baked. This is undesirable because of the time consuming process steps involved and the built up film can still crack in the final cure. The final step in the forming of the spin-on-glass layer is curing at very high temperature. This breaks-down the siloxane material and crosslinks it to a silicon dioxide-like material. To obtain a water-free, carbon-free and silanol-free spin-on-glass layer, very high temperatures, typically 800°–900° C., are required in the final curing step. Unfortunately, in integrated circuit fabrication, the maximum temperature at which spin-on-glass film can be cured is often limited to about 450° C. because of the possibility of melting aluminum interconnects.

After a cure at this lower temperature, the spin-on-glass film contains significant amounts of residual silanols and carbon, and can readily absorb water. The dielectric properties (for example, dielectric constant) of a spin-on-glass film are influenced by the silanol and water content of the film. In the fabrication of integrated circuits it is important to have a low dielectric constant in the spin-on-glass since it becomes the insulating barrier between signal conductors and thus, will determine the upper operating frequency of a circuit. A major disadvantage of thermal methods of curing spin on glass at high temperature is cracking of the spin-on-glass film. Because the spin-on-glass is constrained in a horizontal plane (at the substrate interface), it can only shrink in the vertical direction. This creates great stresses in the spin-on-glass film when it has been baked at very high temperature. These stresses, and the subsequent cracking, have limited spin-on-glass applications despite their favorable attributes: planarization and good gap filling ability. Additionally, the etch rate of thermally cured spin-on-glass is poor compared to the etch rate of thermally grown oxide. It is, therefore, desirable to have some means of curing spin-on-glass at low temperatures to reduce the subsequent cracking of the spin-on-glass while improving its physical properties.

A number of different techniques have been proposed to address these issues in the prior art. In U.S. Pat. Nos. 5,192,164 & 5,192,715, Sliwa proposed a technique where an etch back of the spin-on-glass creates unfilled voids between the metal interconnects allowing the spin-on-glass to expand and contract during hard curing without cracking. The drawbacks to this approach are extra process steps and potential of contaminants filling the unfilled voids. Subsequent high temperature baking can trap gases within the voids which can then subsequently cause corrosion of the metal conductors.

An alternative method of curing spin-on-glass is by ion implantation. In U.S. Pat. No. 5,192,697, Leong devised a method of curing spin-on-glass using ion implantation, which allows curing at lower temperatures while improving the oxide etch rate. The high energy ions impinge on the spin-on-glass layer causing, heating and crosslinking. Disadvantages of this technique are that only relatively thin layers can be cured (~1000–2000 Å), it requires high vacuum environments (<2×10$^{-5}$ Torr) and expensive equipment. Also, high energy ions can cause damage to the lattice structure of the oxides and radiation damage to the underlying active circuits. Even higher and more damaging implant energies are required to penetrate thicker oxide layers. As shown by Moriya (N. Moriya et al., "Modification Effects in Ion-Implanted SiO$_2$ Spin-in-Glass," J. Electrochem. Soc., Vol 140, No. 5, May 1993, pp. 1442–1450), damage induced by the high energy ions can drastically modify the spin-on-glass (SOG) film properties.

Another technique that has been proposed to cure spin-on-glass is utilizing ultra-violet radiation and a hotplate. In U.S. Pat. No. 4,983,546, Hyun et. al. claim to achieve spin-on-glass properties that are better than thermally cured spin-on-glass cured at 420° C. However, the disclosed process does not produce the superior qualities of the spin-on-glasses that have been cured at 800°–900° C. There are still carbon and silanols present that can cause subsequent cracking and delamination due to water absorption by the included carbon.

Young-Bum Koh et. al. ("Direct Patterning of Spin-on-Glass by Focused Ion Beam Irradiation," Jpn. J. Appl. Phys., Vol 31, (1992) pp. 4479–4482) utilized focused ion beam irradiation to crosslink the spin-on-glass. They compare ion beam irradiation of the spin-on-glass with thermal treatments. Whereas carbon is eliminated in thermal cures of 850° C., high doses of ion beam irradiation show a reduction in the carbon but not elimination. They also report that electron beam irradiation requires 2–3 orders of magnitude higher dose than ion beam to crosslink the SOG material. This would indicate that electron beam processing of SOG would require long process times.

In these prior art techniques, if the spin-on-glass film is not cured at 800°–900° C., residual carbon is left in the film. This can cause subsequent cracking and loss of insulating properties, and contamination with the metal interconnects in post cure processing. It is, therefore, desirable to have a means of curing spin-on-glass films at low temperature while achieving the same or superior characteristics of spin-on-glass films cured at high temperature (800°–900° C.).

Spin-on-glass is used to planarize topography on integrated circuits. When filling gaps or cavities of aspect ratio greater than 1, the spin-on-glass will typically crack from shrinkage in thermal processing. Therefore, manufacturers of semiconductor devices have had to utilize complicated and extensive processes to encapsulate the spin-on-glass with CVD based oxides. This multi layer encapsulation adds process steps, is costly, and can create defects. To avoid these problems semiconductor manufacturers keep aspect ratios of the cavities to less than 1 to achieve acceptable process yields and tolerable process margins. To achieve higher aspect ratio gap filling requires multiple spins of thin spin-on-glass interleaved with chemical vapor deposited oxides between the SOG films. The deposited interlayer or CVD films reduce the shrinkage, stresses and cracking. With the push to higher density circuits, the tendency to crack at aspect ratios greater than 1 limits the feature size and packing density that can be achieved. Clearly there is a need for a means of curing spin-on-glass where higher aspect ratio cavity filling can be achieved without cracking.

Crosslinking of siloxane type materials by electron beam irradiation have been reported by numerous workers for direct patterning and use in lithography. Electron beams have been considered for crosslinking of spin-on-glass films. A. Imai and H. Fukuda ("Novel Process for Direct Delineation of Spin on Glass (SOG)," Japanese J. Appl. Physics, Vol. 29, No. 11, 1990, pp. 2653–2656) show a method of crosslinking spin-on-glass using a finely focused electron beam to make the SOG insoluble in a solvent and thereby patterning it directly on a semiconductor substrate. However, Imai and Fukuda only teach the use of an e-beam for patterning the spin-on-glass, not for final curing.

Using high energy electrons to perform final curing of SOG materials is not obvious due to the history of induced damage to semiconductor oxide layers by relatively low dosage exposures of high energy electrons by e-beam lithography tools. Therefore, exposing semiconductor oxides to orders of magnitude higher doses of electrons would seem an anathema to high yield device processing. Moreover, there have been a myriad of deleterious effects found when e-beams expose semiconductor oxides including: charge buildup, production of electronic states at the Si—$SiO_2$ interface, and induced electron traps in oxides. These effects cause the following problems in MOS devices: threshold voltage shifts, channel mobility degradation in transistors, and hot electron effects. Doses utilized in electron beam lithography are in the range of 5 to 100 $\mu C/cm^2$. It would seem that the orders of magnitude higher doses that might be required to fully cure spin-on-glass would cause massive damage to active oxides in semiconductor devices. This may have heretofore discouraged attempts to utilize e-beams for SOG curing.

There is a wealth of prior art showing e-beam damage to semiconductor oxides when irradiated with high doses of electron beam making e-beam irradiation an unobvious choice for curing SOG materials. When high energy electrons are incident on an oxide layer, they generate electron hole pairs. Once generated the pairs can be separated due to a field in the oxide. The electron, being very mobile, transports relatively rapidly to the surface or a conductor layer, whereas the hole may be trapped near the silicon dioxide/silicon interface. This trapping process is referred to as a positive charge build up. Positive charge build up is dependent on temperature. The lower the temperature, the higher the charge build up as the holes are less mobile at lower temperatures. Electronic states at the silicon dioxide/silicon interface cause a subsequent CV curve to be stretched out along the voltage axis instead of an ideal parallel shift. Stretch-out occurs because less silicon bandbending is achieved at a given gate bias when interface states are present.

Interface states can be negatively charged and can affect the threshold voltage in MOS transistors. Electron beam irradiation can cause the creation of neutral electron traps in silicon dioxide films.

Radiation induced neutral electron traps can enhance hot electron instabilities. For MOS transistors with small dimensions, hot electron emission from the silicon substrate into the silicon dioxide layer can occur. A portion of these electrons maybe trapped. This trapped charge causes undesirable affects such as threshold voltage shifts and transconductance degradation.

For all of these reasons, electron beam irradiation of spin-on-glass as a means of curing is not an attractive alternative to the prior art unless it can be done without damaging the active device layers. If electron beam curing of spin-on-glass provides beneficial and superior results over prior art techniques, then a need exists to minimize e-beam damage to oxide layers, while still achieving the high electron beam dose levels required to fully cure the spin-on-glass.

Objects and Advantages

It is the object of this invention to provide an improved low temperature method of curing spin-on-glass material. It is further the object of this invention to provide a means of curing spin-on-glass layers to totally eliminate carbon and achieve a denser and more etch resistant spin-on-glass film while maintaining peak process temperatures under 250° C. It is further the object of this invention to provide a means of curing thick spin-on-glass layers (thicker than can be cured thermally without cracking) in single coats and thereby eliminating multiple coats for thick layers, and being able to cure these spin-on-glass layers without cracking the thick spin-on coating.

It is also the object of this invention to provide a means of curing spin-on-glass films such that thick spin-on-glass can be cured without cracking and aspect ratios of greater than 2 or 3, which are currently impossible with prior art techniques, can be achieved.

Specifically it is the object of this invention to provide an improved method for curing spin-on-glass utilizing electron beam irradiation and infrared heat simultaneously. It is also the object of this invention to provide a means of curing spin-on-glass that protects the spin-on-glass against cracking by applying lower heat than that typically required, while simultaneously improving the properties of the spin-on-glass film. Another object of this invention is to provide a means of irradiating and curing spin on glass layers with large doses of high energy electrons without inducing damage or deleterious effects in the oxide layers.

It is also the object of this invention to provide a means of curing spin-on-glass with a large area uniform electron beam source irradiating spin-on-glass in a soft vacuum (10–40 millitorr) so as to not induce deleterious effects in the SOG film or adjacent oxides. It is further the object of this invention to provide a means of curing spin-on-glass so that it achieves a higher index of refraction, higher etch resistance and higher dielectric strength than can be attained by a thermal curing technique of less than 800° C. A major advantage of this invention is the ability to achieve close to the properties of thermally grown oxides with a low temperature cure of spin on glass.

SUMMARY OF THE INVENTION

The invention disclosed utilizes a large area electron beam to irradiate a spin-on-glass material in a soft vacuum environment in combination with infra-red lamps to indirectly heat the wafer. This novel process cures the spin-on-glass, densifies it, and eliminates all carbon and solvents, while maintaining peak process temperatures under 250° C. The spin-on-glass layer coated on the wafer is irradiated with a blanket electron beam in a soft vacuum while being simultaneously heated. This minimizes any deleterious affects to underlying semiconductor devices and oxides by neutralizing surface charges via positive ions generated by the electron beam in the soft vacuum. The heating of the spin-on-glass (oxide layer) during electron beam irradiation enhances the electron beam induced conductivity of the normally insulating oxide thereby draining charges from within the oxide layer to the neutralized surface.

DESCRIPTION OF THE PREFERRED EMBODIMENTS

Figure 1:
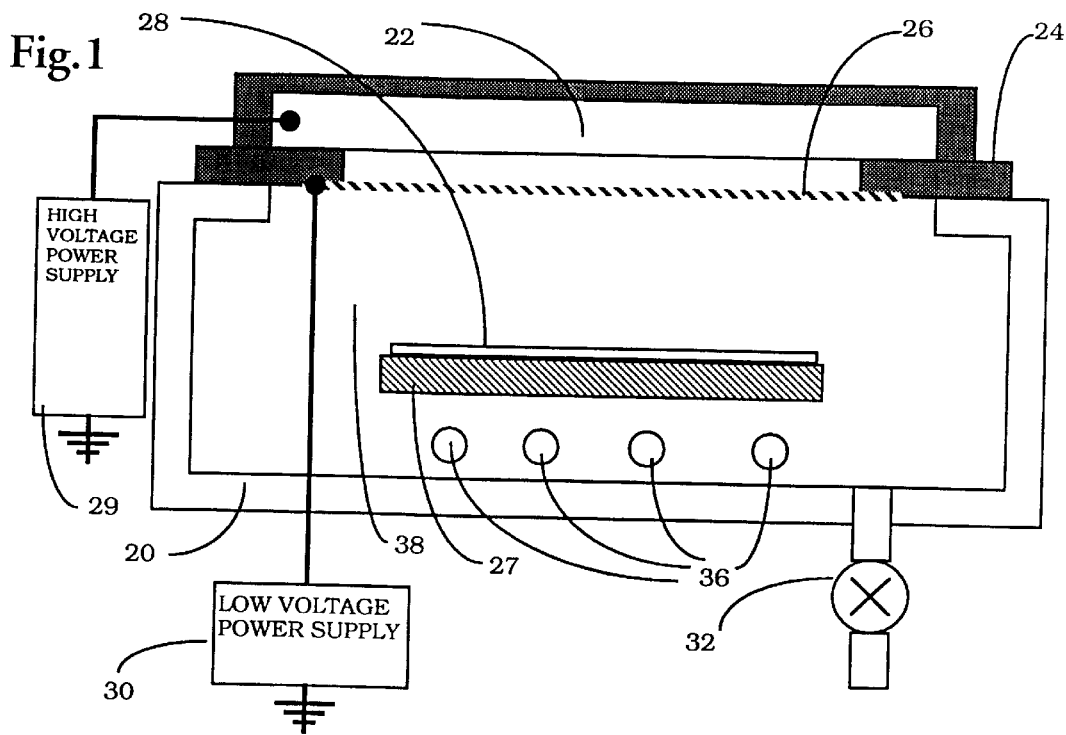
FIGS. 1 and 2 illustrate a cross-sectional view of the process of the invention showing the electron beam exposure apparatus, the substrate being cured and the vacuum chamber.
Figure 2:
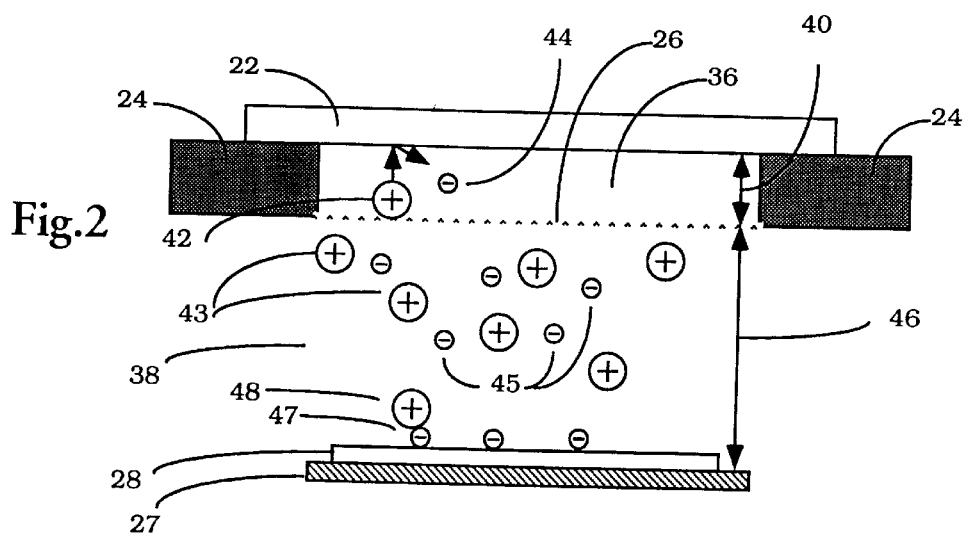

This new and novel method to cure spin-on-glass materials at low temperature is depicted in FIGS. 1 & 2. The substrate 27 is placed in a vacuum chamber 20 at a pressure of 15–40 millitorr and underneath an electron source at a distance from the source sufficient for the electrons to generate ions in their transit between the source and the substrate surface. The electrons can be generated from any type of source that will work within a soft vacuum (15–40 millitorr) environment. A source particularly well suited for this is described in U.S. Pat. No. 5,003,178, the disclosure of which is hereby incorporated into this specification by reference. This is a large uniform and stable source that can operate in a soft vacuum environment. The cathode 22 emits electrons and these are accelerated by the field between the cathode and anode 26. The potential between these two electrodes is generated by the high voltage supply 29 applied to the cathode 22 and the bias voltage supply 30 applied to the anode 26. A sufficient electron energy is selected to fully penetrate the full thickness of the SOG layer (e.g. 9 keV for 6000 Å thick film.) The electrons irradiate the spin on glass layer 28 coated on the substrate 27. Quartz lamps irradiate the bottom side of the substrate providing heating independent from the electron beam. A variable leak valve 32 is utilized to leak in a suitable gas to maintain the soft vacuum environment. Referring to FIG. 2, electrons 45 traversing the distance 46 between the anode 26 and the substrate 27 ionize the gas molecules located in region 38 generating positive ions. These positive ions 43 are then attracted back to the anode 26 where they can be accelerated, as indicated at 42, toward the cathode to generate more electrons. The spin-on-glass film 28 on the substrate 27 is an insulator and will begin to charge negatively, as indicated at 47, under electron bombardment. However, the positive ions near the substrate surface will be attracted to this negative charge and will then neutralize it. The lamps 36 (see FIG. 1) irradiate and heat the wafer or substrate thereby controlling its temperature. Since the wafer is in a vacuum environment and thermally isolated the wafer can be heated or cooled by radiation. If the lamps are extinguished the wafer will radiate away its heat to the surrounding surfaces and gently cool. In the preferred embodiment of the invention the wafer is simultaneously heated by the infrared lamps and irradiated by the electron beam throughout the entire process. The infrared quartz lamps are on continuously until the wafer temperature reaches 200–250° C. The lamps are turned off and on at varying duty cycle to control the wafer temperature. The wafer and spin-on-glass coating are continually irradiated with electrons until a sufficient dose 2500 to 10,000 $\mu C/cm^2$ have accumulated and the spin-on-glass is cured. The heating of the substrate and the bombardment by electron beam drives out the solvents in the spin-on-glass material and crosslinks it into a mostly silicon dioxide material. Using this technique, very thick layers of SOG can be cured in less than ten minutes. Prior to the present invention, layers thicker than 3000 Å have not been able to be cured without cracking. This process provides for curing thick spin-on-glass without cracking. Moreover, aspect ratios of greater than 2 or 3, which are currently impossible using prior art techniques, can be achieved with the method of the invention. In addition we have found that the carbon in the spin-on-glass can be completely eliminated at a peak process temperature of under 200° C. This is a significant result. With the carbon organic group expelled from the oxide film there is no subsequent water take-up by the oxide and the oxide film is seven times more resistant to wet etch processing than films conventionally thermally processed. Further, the combination of large area electron exposure in a soft vacuum environment reduces the deleterious effects of e-beam irradiation. In electron beam lithography a small tightly focused high current density beam is deflected over the substrate. The incident beam on the surface of bare oxides in a high vacuum environment builds up charges on the surface creating high fields across the oxide layers.

By way of contrast, in this invention a large area electron source irradiates the entire wafer in a soft vacuum (10–40 millitorr). The electrons traversing from the anode of the electron gun to the substrate, ionize a portion of the gas molecules creating positive ions. Any charge build up on the surface of the substrate is quickly neutralized by the positive ions in the vicinity of the wafer surface. This allows the exposure of spin-on-glass insulating films without any requirement for a conductive coating to drain off charge. Subsurface charge dissipation (within the insulating or silicon dioxide layer) is achieved by electron beam induced conductivity. The entire wafer is exposed simultaneously by high energy electron beam. Therefore the entire irradiated surface is made conductive and able to dissipate the charge injected by the incident electrons to the surface where they are neutralized by positive ions.

Also, we have found that the combination of large area electron beam irradiation and raising the temperature of the spin-on-glass increases the electron beam conductivity of the oxide layers which dissipate charge build up created by the impinging electron beam. This allows the silicon dioxide to be crosslinked and cured without inducing any electron traps or positive charge build-up in the oxide layers. This is a new and novel result. The electron beam induced conductivity effect is dependent on substrate temperature (becoming more conductive with increasing temperature). The method taught in this invention utilizes substrate temperatures between 150° to 250° C. This process temperature increases the electron beam induced conductivity effect and therefore accentuates the charge dissipation from the bulk subsurface layers reducing or eliminating the formation of electron/hole traps. In early work on electron beam induced conductivity it was found that a bias field across the oxide layer can trap charges in the oxide layer if the electron beam is removed before the bias field is reduced to zero. This is the case with electron beam lithography where a bias field is created by the surface charge on the oxide in high vacuum. Conversely, it was found that no charges are trapped if the bias is reduced to zero prior to removal of the incident electron beam. Since the surface charge is continually neutralized in the electron exposure apparatus taught with this invention a vanishingly small or zero bias across the oxide is present when the incident electron beam is turned off. This duplicates the conditions described above where no charge traps are generated in the oxide layer.

In e-beam lithography, a finely focused beam writes over small portions of the wafer surface. Although the oxide under the incident beam may be conductive, the adjacent areas are not, creating lateral bias fields across device interfaces. With full wafer exposure by the electron beam as taught by this invention, the entire surface of the wafer and buried oxides are made conductive during irradiation and therefore there are no lateral bias fields to create charge traps upon extinction of the incident beam.

In another embodiment of the invention, the infra-red lamps, are not used to heat the wafer. The electron beam is used to both irradiate and heat the wafer. By using very high current density electron irradiation to achieve faster processing times, we have found that the electron beam will heat the wafer. If the power in the beam is greater than the wafer can dissipate by radiation (the wafer is thermally isolated from thermally conductive surfaces) the wafer will heat up. In this case the product of the beam current and the beam voltage (power=current×voltage) is greater than the power radiated away by the wafer, and therefore the wafer is heated by the electron beam.

In a further embodiment of the invention, the wafer or substrate can be cooled via a cooled plate. This will keep the wafer or substrate close to ambient temperature and the spin-on-glass film can still be cured with only electron beam irradiation. This process could be used on devices that cannot tolerate even the 200° C. temperature used in the embodiment described above.

It will be appreciated from the foregoing that the present invention represents a significant advance in the processing of spin-on-glass. Specifically the invention provides a method of curing spin-on-glass material with electron beam irradiation, curing of thick spin-on-glass materials, and curing spin-on-glass materials at much lower temperatures than normally required to eradicate carbon, foreign materials and other contaminants of the SOG films. This improved method can be performed more quickly than high temperature thermal curing. Since it can be performed at low temperatures, it can achieve the desirable properties of SOG films cured at 800° C.–900° C. without risking melting of metallization layers. And by irradiating the SOG films with a large uniform electron beam in a soft vacuum environment, electron beam damage to the sensitive oxides is minimized if not eliminated. It will also be appreciated that, although a number of specific embodiments of the invention have been described in detail for purposes of illustration, various modifications may be made without departing from the spirit and scope of the invention. Accordingly, the invention should not be limited except as by the appended claims.

We claim:

1. A method for curing spin-on-glass materials on a substrate, comprising the steps of:

placing or leaving a spin-on-glass layer formed on a substrate;

irradiating the spin-on-glass layer with a large-area electron beam; and continuing the irradiating step to reach a dose level sufficient to cure the spin-on-glass layer;

wherein the irradiating step results in expulsion of carbon organic groups from the layer.

2. A method as defined in claim 1, wherein the irradiating step is continued to reach a dose level greater than approximately 2,500 $\mu C/cm^2$.

3. A method as defined in claim 1, wherein the irradiating step is continued to reach a dose level greater than approximately 2,500 to 10,000 $\mu C/cm^2$.

4. A method as defined in claim 1, wherein the spin-on-glass layer is cured without cracking or other damage.

5. A method as defined in claim 1, wherein the irradiating step further renders the layer less likely to absorb water.

6. A method for curing spin-on-glass materials on a substrate, comprising the steps of:

placing or leaving a spin-on-glass layer formed on a substrate;

placing the substrate on a cooling plate;

irradiating the spin-on-glass layer with a large-area electron beam at a dose level greater than approximately 2,500 $\mu C/cm^2$, and providing substantially uniform exposure of the surface of the spin-on-glass layer and having sufficient energy to penetrate the layer;

continuing the irradiating step to reach a dose level sufficient to cure the spin-on-glass layer to such a degree that the layer attains enhanced physical properties relative to those obtained by thermal curing at a relatively low temperature;

simultaneously applying heat to the spin-on-glass layer, as a result of energy supplied by the large-area electron beam; and maintaining the layer and the semiconductor substrate at a low temperature relative to those required for complete curing by thermal means, wherein the maintaining step is effected by means of the cooling plate;

whereby the spin-on-glass layer is cured without cracking or other damage.

7. A method as defined in claim 6, wherein the spin-on-glass layer and the semiconductor substrate are maintained at a temperature below approximately 200° C.

8. A method as defined in claim 6 wherein the irradiating step is continued to reach a dose level in the range of approximately 2,500 to 10,000 $\mu C/cm^2$.

9. A method as defined in claim 6, wherein the irradiating step results in expulsion of a carbon organic group material from the layer, which renders the layer less likely to absorb water.

10. A method for curing spin-on-glass materials on a substrate, comprising the steps of:

placing or leaving a spin-on-glass layer formed on a substrate;

irradiating the spin-on-glass layer with a large-area electron beam at a dose level greater than approximately 2,500 $\mu C/cm^2$, generated in a vacuum chamber and providing substantially uniform exposure of the surface of the spin-on-glass layer and having sufficient energy to penetrate the layer;

continuing the irradiating step to reach a dose level sufficient to cure the spin-on-glass layer; and simultaneously applying heat to the spin-on-glass layer, but maintaining the layer at a low temperature relative to those required for complete curing by thermal means;

whereby the spin-on-glass layer is cured without cracking or other damage.

11. A method as set forth in claim 10, wherein the step of continuing the irradiating step cures the spin-on-glass layer to such a degree that the layer attains enhanced physical properties relative to those obtained by thermal curing at a relatively low temperature.

12. A method as defined in claim 10, wherein:

the method is performed in a soft vacuum environment having a relatively high vacuum pressure in the range 10–40 millitorr.

13. A method as defined in claim 10, wherein:

the curing process takes place at peak temperatures less than approximately 250° C.

14. A method as defined in claim 10, wherein:

the step of applying heat includes activating infrared heaters directed at the spin-on-glass layer.

15. A method as defined in claim 10, wherein:

the step of applying heat includes heating the spin-on-glass solely as a result of energy supplied by the large-area electron beam.

16. A method as defined in claim 10, wherein the irradiating step results in expulsion of a carbon organic group material from the layer, which renders the layer less likely to absorb water after curing.

17. A method as defined in claim 10 wherein the irradiating step is continued to reach a dose level in the range of approximately 2,500 to 10,000 $\mu C/cm^2$.

18. A method for curing spin-on-glass materials on a substrate, comprising the steps of:

placing or leaving a spin-on-glass layer formed on a substrate;

irradiating the spin-on-glass layer with a large-area electron beam at a dose level greater than approximately 2,500 $\mu C/cm^2$, and providing substantially uniform exposure of the surface of the spin-on-glass layer and having sufficient energy to penetrate the layer;

continuing the irradiating step to reach a dose level sufficient to cure the spin-on-glass layer to such a degree that the layer attains enhanced physical properties relative to those obtained by thermal curing at a relatively low temperature;

simultaneously applying heat to the spin-on-glass layer, but maintaining the layer at a low temperature relative to those required for complete curing by thermal means;

maintaining in the vacuum chamber a soft vacuum having a relatively high vacuum pressure in the range of 10–40 millitorr, whereby any surface charge build-up, occurring as a result of electron irradiation of the spin-on-glass layer, is neutralized by positive ions formed near the surface of the layer; and inducing increased conductivity in the spin-on-glass layer, as a result of the impinging electron beam and increased temperature, whereby electrical charge is more readily dissipated from subsurface layers of spin-on-glass, and the occurrence of electron/hole traps associated with electron beam radiation is reduced or eliminated; and whereby the spin-on-glass layer is cured without cracking or other damage.

19. A method for curing spin-on-glass materials on a substrate, comprising the steps of:

placing or leaving a spin-on-glass layer formed on a substrate;

irradiating the spin-on-glass layer with a large-area electron beam at a dose level greater than approximately 2,500 $\mu C/cm^2$; and continuing the irradiating step to reach a dose level sufficient to cure the spin-on-glass layer;

whereby the spin-on-glass layer is cured without cracking or other damage.

20. A method as defined in claim 19, wherein the step of continuing the irradiating step cures the spin-on-glass layer to such a degree that the layer attains enhanced physical properties relative to those obtained by low-temperature thermal curing.

21. A method as defined in claim 20, wherein the step of continuing the irradiating step yields a cured spin-on-glass layer having a substantially lower proportion of carbon organic groups.

22. A method as defined in claim 20, wherein the step of continuing the irradiating step yields a cured spin-on-glass layer having a relatively high index of refraction.

23. A method as defined in claim 20, wherein the step of continuing the irradiating step yields a cured spin-on-glass layer that is relatively more dense.

24. A method as defined in claim 19, and further comprising:

simultaneously applying heat to the spin-on-glass layer, but maintaining the layer at a low temperature relative to those required for complete curing by thermal means.

25. A method as defined in claim 24, wherein the step of applying heat includes activating infrared heaters directed at the spin-on-glass layer.

26. A method as defined in claim 24, wherein the step of applying heat includes heating the spin-on-glass layer solely as a result of energy supplied by the electron beam.

27. A method as defined in claim 19, wherein the irradiating step is performed using a large-area electron beam.

28. A method as defined in claim 27, wherein the large-area electron beam provides substantially uniform exposure of the spin-on-glass layer.

29. A method as defined in claim 28, wherein the large-area electron beam has sufficient energy to penetrate the entire thickness of the spin-on-glass layer.

30. A method as defined in claim 19, wherein the irradiating step is continued to reach a dose level greater than approximately 2,500 to 10,000 $\mu C/cm^2$.

* * * * *